(12) United States Patent
Fallet et al.

(10) Patent No.: US 8,726,726 B2
(45) Date of Patent: May 20, 2014

(54) SENSOR UNIT FOR A LOGGING TOOL AND A LOGGING TOOL WITH AT LEAST TWO SENSOR ELEMENTS

(75) Inventors: Truls Fallet, Oslo (NO); Per Schjølberg-Henriksen, Oslo (NO)

(73) Assignee: Sinvent AS, Trondheim (NO)

( * ) Notice: Subject to any disclaimer, the term of this patent is extended or adjusted under 35 U.S.C. 154(b) by 223 days.

(21) Appl. No.: 13/380,607

(22) PCT Filed: Jun. 24, 2010

(86) PCT No.: PCT/NO2010/000244
§ 371 (c)(1),
(2), (4) Date: Feb. 28, 2012

(87) PCT Pub. No.: WO2010/151143
PCT Pub. Date: Dec. 29, 2010

(65) Prior Publication Data
US 2012/0144913 A1    Jun. 14, 2012

(30) Foreign Application Priority Data
Jun. 25, 2009  (NO) .................................. 20092429

(51) Int. Cl.
*E21B 47/06*    (2012.01)
*G01L 11/00*    (2006.01)

(52) U.S. Cl.
USPC ......................................... 73/152.51; 73/702

(58) Field of Classification Search
USPC ................ 73/152.51, 700, 756, 702
See application file for complete search history.

(56) References Cited

U.S. PATENT DOCUMENTS

| 3,660,809 | A | | 5/1972 | Pearson |
| 3,947,802 | A | | 3/1976 | Tims et al. |
| 4,932,003 | A | | 6/1990 | Winbow et al. |
| 5,030,873 | A | * | 7/1991 | Owen ........................... 310/337 |
| H1308 | H | * | 5/1994 | Winbow et al. ................ 367/157 |
| 5,357,486 | A | | 10/1994 | Pearce |
| 5,387,767 | A | * | 2/1995 | Aron et al. ....................... 367/25 |
| 5,936,913 | A | * | 8/1999 | Gill et al. ......................... 367/25 |
| 6,147,932 | A | | 11/2000 | Drumheller |
| 7,328,624 | B2 | * | 2/2008 | Gysling et al. .................. 73/736 |
| 2011/0192222 | A1 | * | 8/2011 | Vetter ........................ 73/152.58 |

FOREIGN PATENT DOCUMENTS

CN    2281414 Y    5/1998

OTHER PUBLICATIONS

International Search Report issued Sep. 8, 2010 in corresponding International Application No. PCT/NO2010/000244.
Written Opinion of the International Searching Authority issued Sep. 8, 2010 in corresponding International Application No. PCT/NO2010/000244.
Norwegian Search Report issued Dec. 21, 2009 in corresponding Norwegian Application No. 20092429.

* cited by examiner

*Primary Examiner* — John Fitzgerald
(74) *Attorney, Agent, or Firm* — Wendroth, Lind & Ponack, L.L.P.

(57) ABSTRACT

The present invention concerns a dynamic pressure sensor unit (5A) for a logging tool for hydrocarbon wells with a piezoelectric element (5) in a sensor sleeve (3). The piezoelectric element (5) is a tubular element with an inner and an outer diameter. The sensor sleeve (3) has an inner cylindrical area with an inner diameter greater than the outer diameter of the tubular piezoelectric element (5). The piezoelectric element is situated in the inner cylindrical area of the sensor sleeve (3). A gap (12) with a gap thickness is formed between the inner cylindrical area of the sensor sleeve (3), defining an annular volume. The gap is filled with a noise transmitting liquid.

6 Claims, 3 Drawing Sheets

SENSOR UNIT FOR A LOGGING TOOL AND A LOGGING TOOL WITH AT LEAST TWO SENSOR ELEMENTS

The present invention concerns a dynamic pressure sensor unit for a logging tool and a logging tool with at least two sensor units positioned at a predetermined distance therein between. The dynamic pressure sensor unit is a noise recording tool for recording or logging level, spectral distribution and directions of sound in a well. Signals from the unit may be transmitted or stored on suitable storage media as representative time series over specified time intervals for real time or delayed analysis when the logging has been performed and the tool is retrieved. The dynamic pressure sensor unit is made as a hydrophone particularly adapted to the high static pressure in a well and to record a wide frequency response range with special attention to frequencies below 100 Hz. A logging tool may be used with one or several built-in sensor units. The advantage of using two or more sensor units placed at a distance from each other, is that the time series between the two or all the sensors may be correlated to determine the direction of propagation, in addition to spectral distribution and the magnitude of the sound signals. The present invention solves the challenge to obtain high sensitivity ($\mu$Pa) under static pressure conditions ranging up to $10^8$ Pa.

PRIOR ART

An acoustic transducer tool for use in downhole applications is shown in U.S. Pat. No. 6,147,932. The tool includes a single cylindrical mandrel including a shoulder defining the boundary of a narrow portion over which is placed a sandwich style piezoelectric transducer assembly. The sandwich-style transducer comprises two cylindrical thermal expansion compensators and a stack of washer-shaped piezoelectric elements positioned between the compensators. Thus, the sandwich-style transducer includes a hollow cylindrical component including both an inner and outer annular surface as well as first and second edges, one on each end of the component. The sandwich-style transducer is positioned over the narrower portion of the mandrel so that its first edge is flush against the mandrel shoulder.

A piezoelectric ceramic transducer assembly for a broadband noise measuring hydrophone is shown in U.S. Pat. No. 3,947,802. The transducer includes two concentric piezoelectric cylinders provided with end caps sealed by o-rings. One of the cylinders is circumferentially polarized and the other is longitudinally polarized.

A marine hydrophone with piezoelectric rings is shown in U.S. Pat. No. 3,660,809. The rings are radially polarized and are placed concentrically in a cylindrical tube.

An acoustic transducer where a piezoelectric film strip is wrapped a plurality of times around a flexible inert mandrel that has standoff collars on each end, is shown in U.S. Pat. No. 5,357,486. The film-wrapped mandrel is hermetically sealed inside a hollow rigid inert cylinder. Electrodes provide electrical communication with the film strip which forms the active element of the transducer. Variations in hydro-dynamic pressure flex the film strip in tension to generate a voltage.

SUMMARY OF THE INVENTION

In its most basic configuration, the noise recording tool of the invention may only be a sensor unit with a ring shaped piezoelectric sensor in a sleeve or housing, typically with a cylindrical shape, where pressure fluctuations (noise) or dynamic pressure results in oscillating strain in the housing, and further in the piezoelectric sensor. The housing protects the sensor element while the design may furthermore offer a mechanical amplification of the pressure fluctuations transferred to the piezoelectric sensor. A transfer liquid in a sealed gap between the sensor housing and the piezoelectric sensor transfers the stress fluctuations from the housing and to the sensor, without transferring static pressure on the housing to the piezoelectric sensor as explained below. The invention is designed for use downhole at high static pressure. This pressure is several magnitudes higher than the pressure fluctuations to be measured. It is important to shield the sensor element from the static strains due to the high static well pressure and heat expansion. This may be done with a pressure control system for the dynamic pressure or noise transmitting liquid to prevent pressure fluctuations on the piezoelectric element when the housing is exposed high static pressures, high temperatures etc The pressure control system may be quite simply sealing the gap between the sensor element and the outer housing with O-rings or similar seals, and to allow these seals to move in relatively wide notches and thus compensate for liquid expansion and compression of the outer housing as a volume in the gap (the liquid volume) is allowed to stay more or less the same even when the housing is compressed by the static pressure, ie maintaining substantially the same pressure in the liquid regardless of the static pressure the dynamic pressure sensor unit is exposed to. The sleeve or housing is sealed and contains a compressible fluid, such that the inner components not are exposed to the static pressure, and to allow the piezoelectric sensor to operate undisturbed. Furthermore, it is normally be required that the sensor is electrically insulated from the housing, as the housing in most cases will be electrically conducting. In most cases, the outer housing is made of a high strength steel alloy suitable for downhole operation. The electrical insulation between the components may be necessary to prevent any unwanted signals from the housing, and the housing may be grounded in relation to electronics for processing the signal from the sensor. Accordingly the transfer liquid should combine low compressibility and good insulating properties, for instance vacuum filled silicone oil.

DETAILED DESCRIPTION OF AN EMBODIMENT

The invention concerns a dynamic pressure sensor unit acting as a noise recording sensor unit for a logging tool for hydrocarbon wells with a tubular or annular piezoelectric element with an inner and an outer diameter in a sensor sleeve. The sensor sleeve has an inner area with an inner diameter greater than the outer diameter of the tubular piezoelectric element. The piezoelectric element is situated in the inner area of the sensor sleeve, whereby a gap with a gap thickness is formed between the inner area of the sensor sleeve and the piezoelectric element, defining an annular volume. The annular volume is filled with dynamic pressure transmitting liquid. A pressure control system for the dynamic pressure transmitting liquid prevents pressure variations on the piezoelectric element when the sensor unit is exposed to variations in static pressure, temperature or other ambient conditions. The pressure control system for said dynamic pressure transmitting liquid includes at least one seal is placed in a circumferential notch in the sensor sleeve. The notch is dimensioned to allow the seal to move in the notch in an axial direction in relation to the sensor sleeve while maintaining a seal between the sensor sleeve and the piezoelectric element. Pressure is controlled by allowing the seal to adjust the volume of the dynamic pressure transmitting liquid in relation to the gap thickness and thermal oil expansion.

The piezoelectric element may be metalized on the curved surfaces on the inside and outside.

The gap may be sealed with O-rings which easily can move in axial direction and thus forming the pressure control system for the noise transmitting liquid to prevent pressure fluctuations on the piezoelectric element when the sensor unit is exposed to variations in static pressure, temperature, thermal expansion of the noise transmitting liquid etc.

The piezoelectric element may typically be circumferentially polarized, in that the inner and outer surfaces of the tubular piezoelectric element are coated with an electrically conducting material connected to the electronic circuitry receiving signals from the element.

The at least one seal between the sensor sleeve and the piezoelectric element may be an o-ring, but other seals may clearly also be used.

In the case with two seals such as o-rings, must at least one of the notches be dimensioned to allow axial displacement of the seal to compensate for the variations in inner diameter of the sensor sleeve etc. The width of the notch or notches is dictated by the amount of travel necessary for the o-ring or rings in order to compensate for the reduction of diameter of the sleeve when this is exposed to the downhole pressure etc.

The tubular piezoelectric element is typically a ring of lead zirconate titanate (PTZ) with high Curie temperature in order to cope with the well temperatures, and the liquid may be silicone oil. The noise transmitting liquid should preferably be incompressible, dielectric and inert, and trapped gas should be avoided to maintain the noise transmitting properties.

Furthermore the invention concerns a logging tool with a first and a second sensor unit positioned with a predetermined distance therein between as described above, typically separated a half meter or more. Signals from the two units may be correlated in time and thus used to determine the propagation direction of the sound.

SHORT DESCRIPTION OF THE FIGURES

DETAILED DESCRIPTION OF EMBODIMENTS OF THE INVENTION WITH REFERENCE TO THE ENCLOSED FIGURES

Figure 1:
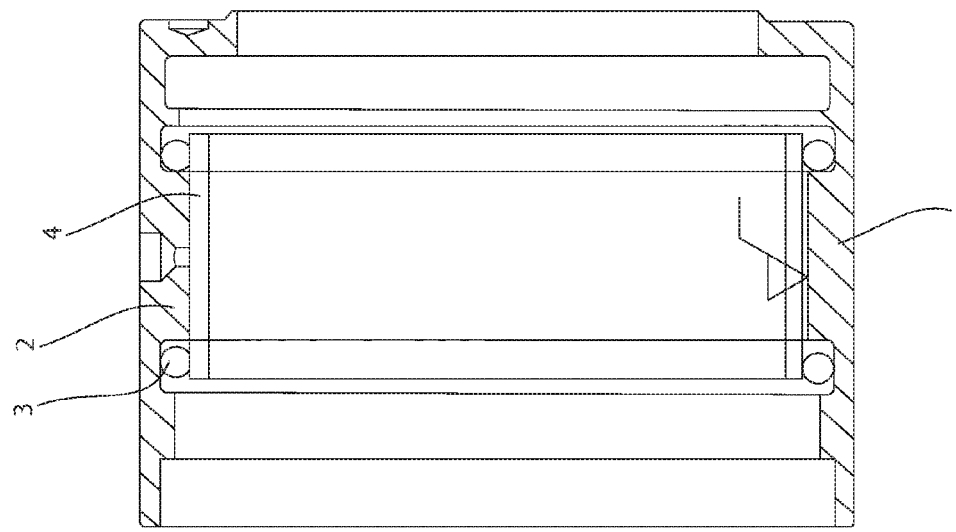
FIG. 1 is a cross section of a specific embodiment of a noise recording tool according to the invention.

FIG. 1 shows a specific detail of a sensor unit of the invention in cross section. In FIG. 1, the piezoelectric sensor 5, shown as a short tubular element, or hollow cylindrical sleeve, is placed between two O-rings 11 in the sensor sleeve 3. A gap 12 is formed between the sensor sleeve 3 and the piezoelectric sensor 5, and this gap 12 is sealed by the O-rings 11. This gap is typically filled with a thin layer of silicone oil to transfer the signals from the outside of the sensor sleeve 3 to the piezoelectric element without imposing static loads on the piezoelectric sensor 5. Furthermore, the gap will insulate the sensor element electrically from the sensor sleeve 3. The sensor sleeve 3 acts as a pressure container, and the electrical insulation of the piezoelectric sensor 5 from the sensor sleeve 3 allows a good virtual ground to be used in sensor electronics.

The sensor sleeve 3 may typically be 27 mm long, have an outside diameter of 37.3 mm, and an inside diameter at the location the sensor element 5 of 32.12 mm. The sensor element 5 may typically be 14 mm long, have an outside diameter of 32 mm (−0.02 mm) and an inside diameter of 28 mm. The O-rings 11 may typically have a diameter of 25.12 mm and a thickness of 1.78 mm, and may be placed in notches with notch depth 1.45 mm, width 2.6 mm at the top where electrical connections can be made and 2.6 mm at the bottom. The notch with is sufficient to allow the o-rings a certain axial displacement. The radial clearance or gap 12 between the sensor element 5 and sensor sleeve 3 with no pressure applied may be 0.10+0.02 mm. The sensor sleeve 3 may typically be adapted for installation in a container or housing with an outside diameter of 43 mm. The invention will typically be designed for a maximum temperature of 175° C. and maximum pressure of 1000 bar.

Figure 2A:
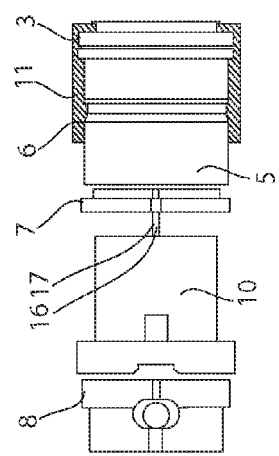
FIG. 2a is an exploded view of a noise recording tool according to the invention for assembly in a logging tool.

FIG. 2a is an exploded view, showing details of a sensor unit 5A according to the invention. The sensor unit 5A includes a piezoelectric sensor 5 in a sensor sleeve 3. The piezoelectric sensor 5 is placed between two stop rings 6 and 7. A shield ring 10 extends into the piezoelectric sensor 5 and is connected to a joint ring 8. The shield ring 10 protects the piezoelectric element.

Figure 2B:
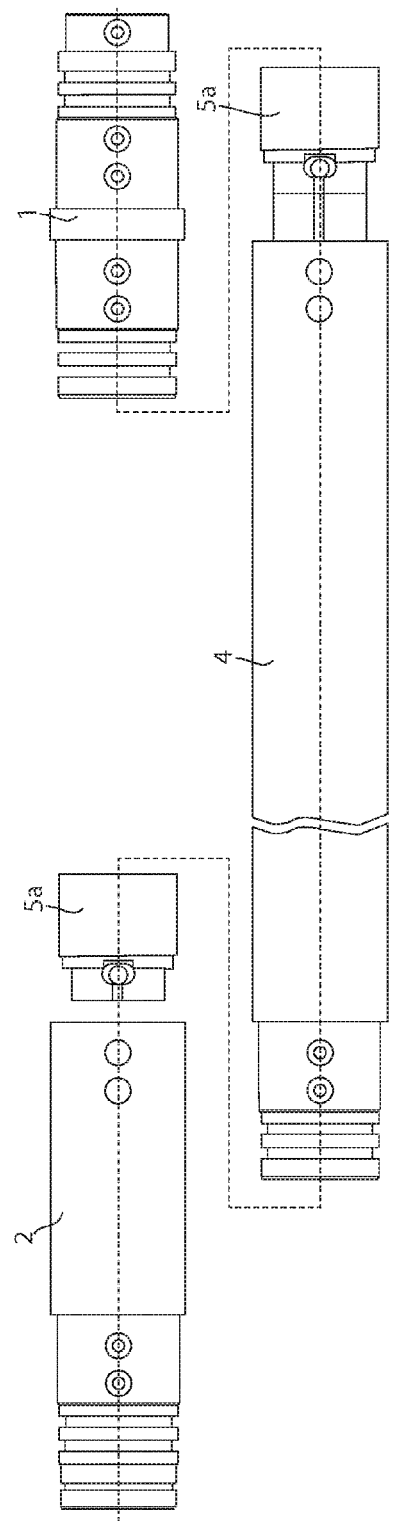
FIG. 2b is a exploded view of a logging tool according to the invention.

FIG. 2b is an exploded view of a logging tool according to the invention where an upper and a lower sensor unit 5A as shown on FIG. 1 are included. The shown elements have a substantially circular cross section. The logging tool includes a lower sensor housing 4, and an upper sensor housing 2. The upper sensor unit 5A is placed inside the upper sensor housing 2. The lower sensor unit 5A is held inside the lower sensor housing 4. A dual male adapter 1 is also shown. A sensor wire 16 extends from the piezoelectric sensor 5 inside heat shrink tubing 17, for connecting the piezoelectric sensor 5 to suitable circuits.

Figure 3:
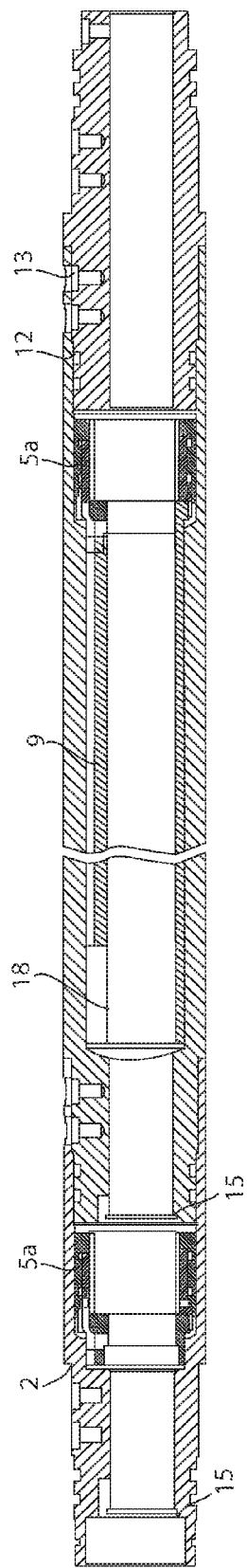
FIG. 3 is a cross section of the logging tool of FIG. 2b with two sensor units according to the invention.

FIG. 3 is a cross section of the logging tool of FIG. 2a, FIG. 2b, showing how the various parts are assembled. FIG. 3 clearly shows how the upper and lower sensor units 5A are installed with a certain distance therein between. The sensor unit 5A is installed in an upper sensor housing 2 and the sensor unit 5A is installed in a lower sensor housing 4. FIG. 3 furthermore shows a cable support 9 inside the lower sensor housing 4, a dual male adapter 1 attached to the lower sensor housing 4, and a cable 18 for connecting the piezoelectric sensors to suitable electrical circuits. The upper sensor housing 2 is connected to the lower sensor housing 4, and the upper and lower housings 2, 4 are mechanically connected to the sensor sleeves of the sensor units 5A such that the pressure pulses are transferred to from the housings to the piezoelectric sensors of the sensor units 5A.

Typical dimensions for the components of the logging tool shown in FIG. 3 are as follows. The dual male adapter 1 has a diameter of 43 mm and a length of 121.8 mm. The upper sensor housing 2 has an outer diameter of 43 mm and a length of 155 mm. The lower sensor housing has a diameter of 43 mm and a length of 700 mm. The stop ring 6 has a diameter of 32 mm and is 6 mm thick. The stop ring 7 has a diameter of 33 mm and a thickness of 5 mm. The joint ring 8 has typically an outer diameter of 33 mm and a length of 16 mm and the cable support 9 has an outer diameter of 29.5 mm and a length of 558 mm.

The sleeve may be made of steel or any suitable alloy. However any material with suitable properties can be used.

The piezo ceram insert 5 may for instance be of lead zirconate titanate (PZT). Other piezoelectric materials may clearly also be used.

The dynamic pressure sensor unit for of the invention may be designed such that it is achieved a natural, mechanical "amplification" of the pressures the piezoelectric insert is exposed to.

The invention claimed is:

1. A dynamic pressure sensor unit (5A) for a logging tool for hydrocarbon wells with a piezoelectric element (5) in a sensor sleeve (3), wherein the piezoelectric element (5) is a tubular element with an inner and an outer diameter;

the sensor sleeve (3) has an inner area with an inner diameter greater than the outer diameter of the tubular piezoelectric element (5);

the piezoelectric element is situated in the inner area of the sensor sleeve (3), whereby a gap (12) with a gap thickness is formed between the inner area of the sensor sleeve (3) and the piezoelectric element (5), defining an annular volume;

a dynamic pressure transmitting liquid in said annular volume;

characterized in a pressure control system for said a dynamic pressure transmitting liquid to prevent pressure variations on the piezoelectric element (5) when the sensor unit (5A) is exposed to variations in static pressure, temperature or other ambient conditions, wherein the pressure control system for said dynamic pressure transmitting liquid includes at least one seal is placed in a circumferential notch in the sensor sleeve (3), and wherein said notch is dimensioned to allow the seal to move in the notch in an axial direction in relation to the sensor sleeve while maintaining a seal between the sensor sleeve (3) and the piezoelectric element (5) whereby pressure is controlled by allowing the seal to adjust the volume of the dynamic pressure transmitting liquid in relation to the gap thickness and thermal oil expansion.

2. The sensor unit (5A) according to claim 1, wherein the at least one seal (11) between the sensor sleeve (3) and the piezoelectric element (5) is an o-ring.

3. The sensor unit (5A) according to claim 1, wherein the inner and outer diameter of the tubular piezoelectric element (5) are coated with an electrically conducting material, and are connected to a circuit for receiving signals from the element.

4. The sensor unit (5A) according to claim 1, wherein the tubular element (5) is made of a high temperature piezoelectric material, typically lead zirconate titanate (PTZ).

5. The sensor unit (5A) according to claim 1, wherein the dynamic pressure transmitting liquid is silicone oil.

6. A logging tool with at least two dynamic pressure sensor units (5A) according to claim 1 positioned with a predetermined distance therein between for determining noise propagation direction in the well through the use of correlation techniques.

* * * * *